United States Patent [19]

Rosenau et al.

[11] Patent Number: 5,217,571
[45] Date of Patent: Jun. 8, 1993

[54] SURFACE TREATMENT OF MOLDINGS BASED ON LIQUID CRYSTALLINE POLYMERS

[75] Inventors: Bernhard Rosenau, Neustadt; Bernd Hisgen, Neuhofen; Gerhard Heinz, Weisenheim; Graham E. McKee, Weinheim; Helmut Muenstedt, Wachenheim; Wolfgang Eberle, Mainz; Hartmut Zeiner, Ludwigshafen, all of Fed. Rep. of Germany

[73] Assignee: BASF Aktiengesellschaft, Ludwigshafen, Fed. Rep. of Germany

[21] Appl. No.: 754,849

[22] Filed: Sep. 4, 1991

[30] Foreign Application Priority Data

Sep. 6, 1990 [DE] Fed. Rep. of Germany ....... 4028210

[51] Int. Cl.⁵ .............................................. B05D 1/00
[52] U.S. Cl. .................................... 156/668; 427/307; 252/79.2; 252/79.4; 252/79.5
[58] Field of Search ............... 156/668; 252/79.2, 79.5, 252/79.4; 427/307

[56] References Cited

U.S. PATENT DOCUMENTS

| | | | |
|---|---|---|---|
| 4,426,253 | 1/1984 | Kreuz et al. | 156/668 |
| 4,950,360 | 8/1991 | Murao et al. | 156/668 |
| 4,997,724 | 3/1991 | Suzuki et al. | 156/668 X |

FOREIGN PATENT DOCUMENTS

| | | |
|---|---|---|
| 305846 | 3/1989 | European Pat. Off. |
| 0311232 | 4/1989 | European Pat. Off. |
| 312268 | 4/1989 | European Pat. Off. |

*Primary Examiner*—Thi Dang
*Attorney, Agent, or Firm*—Herbert B. Keil

[57] ABSTRACT

A process for the surface treatment of moldings based on liquid crystalline polymers with acidic or alkaline reagents includes using the reagents in a solvent which is an organic solvent to an extent of not less than 60% by weight.

6 Claims, No Drawings

SURFACE TREATMENT OF MOLDINGS BASED ON LIQUID CRYSTALLINE POLYMERS

The present invention relates to a process for the surface treatment of moldings based on liquid crystalline polymers with acid or alkaline reagents.

Liquid crystalline polymers are a group of thermoplastic polymers which are high temperature resistant and possess low thermal expansion coefficients. Moreover, the optically anisotropic melt phase in the production of moldings by injection or extrusion molding creates orientations in the flow direction which suggest interesting applications.

However, moldings based on liquid crystalline polymers are difficult to lacquer or metallize, since the adhesions obtained are not satisfactory. EP-A-312 268 discloses a process whereby, to improve the adhesion for the metallization of moldings based on liquid crystalline polymers, a treatment is carried out with an at least 80% strength by weight aqueous solution of sulfuric acid. The molding composition from which the molding is formed contains from 5 to 80% by weight of a certain inorganic filler.

EP-A-305 846 discloses thermoplastic molding compositions for producing printed circuit boards, which contain as essential components a fibrous inorganic filler and an alkaline earth metal carbonate as well as a liquid crystalline polymer. Prior to metallization, the moldings produced from the molding compositions described are pretreated with aqueous alkaline and acidic reagents in a conventional manner.

The above-described processes do result in an improvement in the adhesion of metal or lacquer films on moldings, but a further improvement would be desirable.

It is an object of the present invention to provide a process for the surface treatment of moldings based on liquid crystalline polymers which is simple to carry out and improves the adhesion of metal or lacquer films applied to the moldings.

We have found that this object is achieved by a process for the surface treatment of moldings based on a liquid crystalline polymer with an alkaline or acidic reagent used in a solvent constituted to at least 60% by weight by an organic solvent. Compared with existing treatment processes, where the pretreatment is carried out with aqueous acids or alkalies, the process of the present invention gives improved adhesions, in particular for a subsequent metallization.

The process of the present invention is for moldings based on liquid crystalline polymers; that is, the basic molding compositions contain at least one liquid crystalline polymer as main constituent, with or without fillers, rubbers and other customary additives.

The liquid crystalline polymers used are thermotropic mesomorphic polymers.

They have an anisotropic melt phase which is readily detectable under a polarizing microscope using the method described in DE-A 25 20 819. Between crossed polarizers, the polymer melts applied in a thickness of 10 μm between glass plates have textures which can be assigned to a mesomorphic phase.

To obtain an anisotropic (liquid crystalline) melt phase generally requires a certain degree of linearity in the main chain, which can be achieved through appropriate choice of the mixing ratios for the monomers. The anisotropy of the melt phase and the attendant orientation of the polymer molecules lead to the moldings produced from such polymers having very high strength and stiffness values.

In general, it can be stated that thermotropic mesomorphic polymers generally contain units derived from a₁) aromatic or aliphatic dicarboxylic acids, a₂) aromatic or aliphatic diols, diamines or corresponding monomers having an amino and a hydroxyl group, a₃) aromatic hydroxy- and amino-carboxylic acids, and a₄) aromatic thiocarboxylic acids, dithiols or thiophenols.

By combining these monomers in appropriate fashion it is possible to prepare for example polyesters, polyesteramides, polyesterimides, polyestercarbonates, polyetheresters, polyetheresteramides, polyesteramideimides, polyestercarbamides and polyetheresterimides.

The compositions of these products can vary within wide limits, and there are a multiplicity of usable monomers. The essential requirement is that the polymers have thermotropic mesomorphic properties, which is readily verifiable by the abovementioned method, described in DE-A 25 20 819.

All combinations of monomers $a_1$) to $a_4$) in any desired molar ratios do not lead to thermotropic mesomorphic polymers, but a general account of suitable mixing ratios is hardly possible.

However, the relevant literature and a multiplicity of patent applications have described suitable thermotropic mesomorphic systems which will hereinafter be further illustrated, starting with an exemplary enumeration of suitable monomers and corresponding polymers.

Monomers $a_1$):

terephthalic acid, isophthalic acid, 2,6-naphthalenedicarboxylic acid, 2,7-naphthalenedicarboxylic acid, 4,4'-dicarboxybiphenyl, 4,4''-dicarboxyterphenyl, dicarboxydiphenyl derivatives of the general formulae I and II

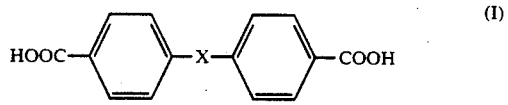

| | |
|---|---|
| X = O | 4,4'-dicarboxydiphenyl ether |
| X = CH₂CH₂ | 1,2-di(4-carboxyphenyl)ethane |
| X = OCH₂CH₂O | 1,2-di(4-carboxyphenoxy)ethane |
| X = O(CH₂)₄O | 1,4-di(4-carboxyphenoxy)butane |

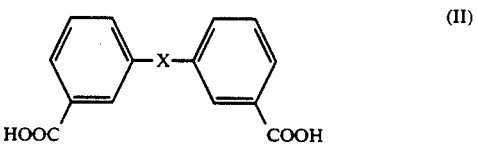

| | |
|---|---|
| X = O | 3,3'-dicarboxydiphenyl ether |
| X = CH₂CH₂ | 1,2-di(3-carboxyphenyl)ethane |
| X = OCH₂CH₂O | 1,2-di(3-carboxyphenoxy)ethane |
| X = O(CH₂)₄O | 1,4-di(3-carboxyphenoxy)butane |

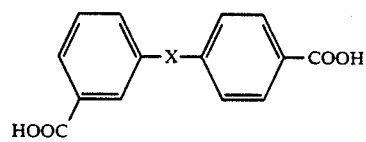

-continued
X = O          3,4'-dicarboxydiphenyl ether
X = CH₂CH₂     1,2-di(3,4'-dicarboxy)diphenylethane
X = OCH₂CH₂O   1,2-di(4-dicarboxydiphenyl)ethane
X = O(CH₂)₄O   1,4-di(3,4'-dicarboxy)diphenoxybutane Other possibilities are dicarboxylic acids of the general formulae III and IV

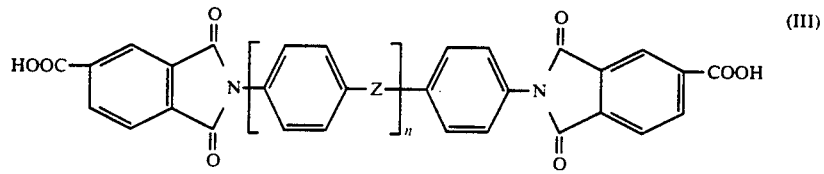  (III)

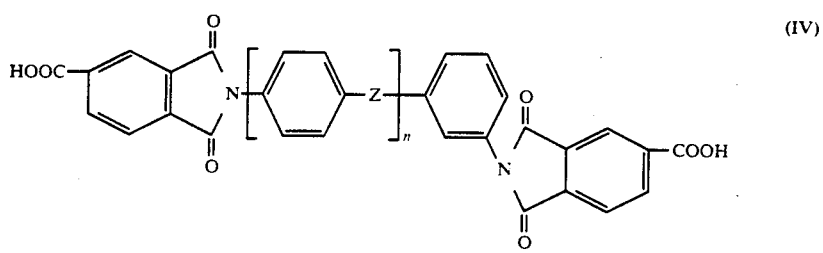  (IV)

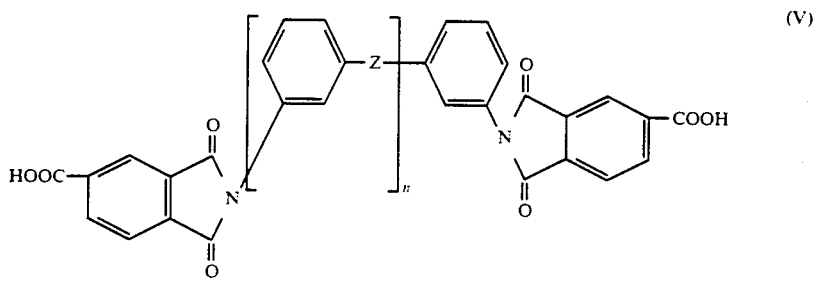  (V)

where Z is in each case —O—, —S—, —SO₂—, —CH₂—, —C(CH₃)₂— or a chemical bond, and n is 0 or 1.

Examples thereof are

Z=O   4,4'-, 3,4'- or 3,3'-di(4-carboxy-N-phthalimido)diphenyl ether
Z=CH₂  4,4'-, 3,4'- or 3,3'-di(4-carboxy-N-phthalimido)diphenylmethane
Z=SO₂  4,4'-, 3,4'- or 3,3'-di(4-carboxy-N-phthalimido)diphenyl sulfone
Z=CO   4,4'-, 3,4'- or 3,3'-di(4-carboxy-N-phthalimido)diphenyl ketone
Z=S    4,4'-, 3,4'- or 3,3'-di(4-carboxy-N-phthalimido)diphenyl sulfide and for example Z=C(CH₃)₂  2,2-di-[4,4'-di(4-carboxy-N-phthalimido)phenyl]propane.

Other suitable monomers a₁) are p,p-, m,m- and p,m-dicarboxyphenyl carbonates of the general formulae VI to VIII

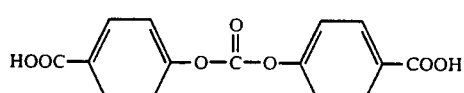  (VI)

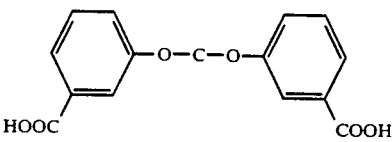  (VII)

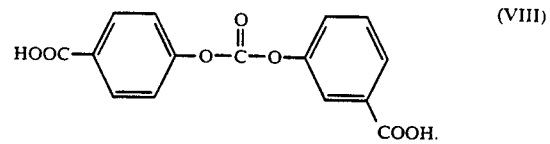  (VIII)

The aforementioned carboxylic acids can also have substituents such as C₁-C₄-alkyl or C₁-C₄-alkoxy groups or halogen atoms. Finally, there may be mentioned some aliphatic dicarboxylic acids such as cis- and trans-1,4-cyclohexanedicarboxylic acid and 1,3-cyclohexanedicarboxylic acid and also their appropriately substituted derivatives.

Monomers a₂:

hydroquinone, methylhydroquinone, phenylhydroquinone, tert-butylhydroquinone, chlorohydroquinone, 4,4'-dihydroxybiphenyl, 1,4-di(4-hydroxyphenyl)benzene, 1,2-di(4-hydroxyphenoxy)ethane, 4,4'-dihydroxydiphenyl ether, 4,4'-dihydroxydiphenyl sulfone, 3,3'-dihydroxybiphenyl, 3,3'-dihydroxydiphenyl ether, 3,4'-dihydroxybiphenyl, 3,4'-dihydroxydiphenyl ether, 2,2-di(4-hydroxyphenyl)propane, 1,6-, 2,6- and 2,7-dihydroxynaphthalene, 3,3',5,5'-tetramethyl-4,4'-dihydroxybiphenyl, 4,4'-di(p-hydroxyphenoxy)diphenyl sulfone, urea, 1,4-diaminobenzene, 1,3-diaminobenzene, 3-aminophenol, 4-aminophenol, trans- and cis-1,4-cyclohexanediol, trans-1,3-cyclohexanediol and cis-1,2-cyclohexanediol. It will be readily understood that here too in general substituents as for the monomers $a_1$) can be present.

Monomers $a_3$:

4-hydroxybenzoic acid, 3-hydroxybenzoic acid, 6-hydroxynaphthalene-2-carboxylic acid, 6-hydroxynaphthalene-1-carboxylic acid, 3-aminobenzoic acid, 4-aminobenzoic acid and their $C_1$–$C_4$-alkyl, $C_1$–$C_4$-alkoxy or halogen derivatives such as 3-methyl-4-hydroxybenzoic acid, 3,5-dimethyl-4-hydroxybenzoic acid, 2,6-dimethyl-4-hydroxybenzoic acid, 3-methoxy-4-hydroxybenzoic acid and 2,5-dichloro-4-hydroxybenzoic acid, to name but a few examples.

Monomers $a_4$:

4-mercaptobenzoic acid, 3-mercaptobenzoic acid, 6-mercaptonaphthalene-2-carboxylic acid, 2,7-dithionaphthalene, 2,6-dithionaphthalene, 1,4-dithiobenzene and 1,3-dithiobenzene and their $C_1$–$C_4$-alkyl, $C_1$–$C_4$-alkoxy and halogen derivatives.

Other suitable monomers of groups $a_1$) to $a_4$) are mentioned for example in EP-A 206 600.

The process of the present invention is preferably carried out with liquid crystalline polymers as described in EP-A-226 839, DE-A-35 42 814, DE-A-35 42 813, DE-A-35 42 777, DE-A-35 42 778, DE-A-35 42 779, DE-A-35 42 855, DE-A-35 42 856, DE-A-35 42 957, DE-A-35 42 796, DE-A-35 42 797, DE-A-35 42 798, DE-A-35 42 831, DE-A-35 42 832, DE-A-35 42 833, DE-A-36 21 519, DE-A-36 22 137, DE-A-36 29 211, DE-A-36 29 210, DE-A-36 29 209, DE-A-36 29 208 and DE-A-37 00 821, of which in particular the liquid crystalline polyesters described in DE-A-36 29 211 have proved advantageous. However, it may be emphasized once more that basically it is possible to use any thermotropic mesomorphic polymer.

In some cases it is advantageous to add a rubber to the liquid crystalline polymer. Suitable rubbers are those which are known per se to the person skilled in the art for impact modifying thermoplastic polymers, although of course care must be taken to ensure that the rubber is stable at the high processing temperatures of the liquid crystalline polymers. Merely by way of example there may be mentioned graft rubbers based on polybutadiene and/or acrylic esters with grafted-on shells of styrene or styrene derivatives, acrylonitrile, methacrylonitrile and/or (meth)acrylic esters. Appropriate products are known to the person skilled in the art and commercially available, so that no details need be given here.

Furthermore, for certain applications it is advantageous to add one or more inorganic fillers to the liquid crystalline polymer.

Suitable for this purpose in particular are the inorganic fibrous materials mentioned in EP-A-305 846. There may be mentioned glass fibers, potassium titanate fibers, wollastonite, ceramic $Al_2O_3/SiO_2$ fibers, boron fibers, silicon carbide fibers and alkali metal metaphosphate fibers, of which glass fibers, potassium titanate fibers and wollastonite are particularly preferred.

These are particularly preferably used together with an alkaline earth metal carbonate, preferably the carbonate of magnesium, calcium, strontium or barium, in particular the eutectic mixture of calcium carbonate and magnesium carbonate, i.e. dolomite.

Other suitable fillers are the EP-A-312 268 oxides, sulfates, phosphates and silicates of metals of main group II of the periodic table and also the oxides of Si, Zn, Pb, Sb and Bi.

The proportion of the aforementioned fillers and rubbers should in general lie within the range from 5 to 80% by weight, preferably from 10 to 50% by weight. If mixtures of fibrous fillers and alkaline earth metal carbonates are used, their respective proportions are preferably from 3 to 50, in particular from 10 to 40, and from 3 to 30, in particular from 5 to 20, % by weight, based on the total weight of the molding composition. The molding compositions can be prepared in a conventional manner by mixing the components on an extruder or in another suitable mixing apparatus, such as a Henschel mixer or a Banbury mixer. Appropriate techniques are known to the person skilled in the art.

The moldings to be treated by the process of the present invention are preferably prepared from the molding compositions by injection molding, although it is also possible to use any other known process for preparing moldings from thermoplastic molding compositions.

The novel pretreatment with acid or alkaline reagents is carried out by treating the moldings with a solution of these reagents which is at least 60, preferably at least 80%, and especially 100% by weight organic solvent. Suitable acidic reagents are in particular oxygen acids of elements of main group V to VII of the periodic table. Examples thereof are the oxygen acids of sulfur, phosphor and nitrogen, e.g. $H_2SO_4$, $HNO_3$, $H_3PO_4$ and also chromosulfuric acid, to name but a few. It is also possible to use the hydrohalic acids HCl, HBr, HI and HF, of which HCl is preferred. Preferred alkaline reagents are alkali metal and alkaline earth metal hydroxides, in particular NaOH, KOH, $Ba(OH)_2$ and $Ca(OH)_2$ or mixtures thereof. It is also possible and may at times be advantageous to carry out the treatment with both an acidic and an alkaline reagent.

The pretreatment agents are used in the process of the present invention in a predominantly organic solvent, which may contain up to 40% by weight of water. Suitable organic solvents are in particular lower alcohols, ketones and carboxylic esters or dipolar aprotic solvents such as N-methylpyrrolidone. Owing to their inexpensiveness and ready availability, alcohols of from 1 to 4 carbon atoms, in particular methanol, ethanol, isopropanol, n-propanol and the isomeric butanols, are particularly preferred.

It is also possible to use mixtures of various organic solvents.

The temperature at which the pretreatment is carried out is in general within the range from 10° C. to the boiling point of the solvent in which the acidic or alkaline reagents have been dissolved. Preference is given to the treatment at room temperature, since no temperature control means are necessary.

The concentration of the reagents in the solvent is basically not subject to any particular restriction; the higher the concentration of the solution is, the shorter in general the treatment time can be or the lower the treatment temperature can be.

The treatment time ranges in general from 10 seconds to 60 minutes, preferably from 1 to 40 minutes.

The process of the present invention gives moldings having a surface which is readily metallizable or lacquerable. Metallization and lacquering can be effected with the customary processes known to the person skilled in the art.

Especially, the first metal coat can be applied physically or wet-chemically and then be enhanced to the desired thickness by electroless plating or by electroplating.

Examples of physical processes are physical vapor deposition (PVD) and low pressure plasma sputtering.

Customary wet-chemical processes generally comprise conditioning, etching, optional neutralizing, activating, nucleating and electroless metallization.

EXAMPLES

A: Preparation of Liquid Crystalline Polymer

A stirred autoclave of 70 l nominal capacity was charged with 28 mol of terephthalic acid, 12 mol of isophthalic acid, 60 mol of p-hydroxybenzoic acid, 20 mol of hydroquinone, 20 mol of 4,4'-dihydroxybiphenyl and 189 mol of acetic anhydride, and the reaction was started by heating and stirring. The nominal temperature of the oil heated jacket was first adjusted to 150° C. and then gradually raised to 360° C. in the course of 3 h, in the course of which acetic acid and excess acetic anhydride were distilled off; at the end of this period the internal temperature was 340° C. To complete the polycondensation, the internal pressure was reduced to about 400 mbar in the course of 30-40', resulting in a significant increase in the melt viscosity. The polymer formed was extruded through a die plate into a waterbath and then granulated. Its inherent viscosity was 2.54 dl/g, measured at 60° C. in 0.1% strength (weight/volume) pentafluorophenol solution, while differential thermal analysis and examination with a polarizing microscope showed that the polymer formed a liquid crystalline melt at 320° C.

The liquid crystalline polymer (LCP) thus obtained was melted on a twin-screw extruder (ZSK 30 from Werner & Pfleiderer), any fillers, reinforcing agents, rubbers or other polymers were added, and the mixture was extruded at 330°–360° C. and granulated. Table 1 shows the constitution of the molding compositions.

The molding compositions which contained component R1 or R2 were prepared at 300°–330° C. by adding the rubber (R1 or R2) in the form of an aqueous dispersion and the liberated water was drawn off along the extruder.

TABLE 1

| Molding composition | LCP | Glass fiber | Component (% by weight) PES/R1/R2[1] | Dolomite |
|---|---|---|---|---|
| 1 | 100 | — | — | — |
| 2 | 70 | 30 | — | — |
| 3 | 70 | 20 | — | 10 |
| 4 | 45 | — | 55 PES | — |
| 5 | 45 | — | 35 PES | 20 |
| 6 | 45 | 20 | 25 PES | 10 |
| 7 | 56 | 24 | 20 R1 | — |
| 8 | 56 | 24 | 20 R2 | — |
| 9 | 42 | 18 | 40 PES | — |
| 10 | 38.5 | 16.5 | 35 PES + 10R1 | — |
| 11 | 35 | 15 | 30 PES + 10R2 | 10 |

[1] PES = polyether sulfone of the formula

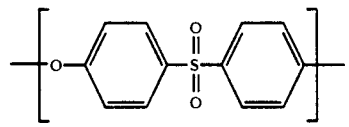

having an intrinsic viscosity of 0.58, measured in a solution (1 g/100 ml) in 1:1 phenol/o-dichlorobenzene at 25° C.

R1 = graft rubber having a grafting base (70% by weight) of n-butyl acrylate/dihydrodicyclopentadienyl acrylate (weight ratio 98:2) and a graft shell of styrene and acrylonitrile in a weight ratio of 3:1, prepared as described in DE-A-24 44 584.

R2 = graft rubber having a grafting base (80% by weight) of polybutadiene and a graft shell of styrene and acrylonitrile in a weight ratio of 3:1, prepared as described in EP-A-22 216.

The resulting granules were injection molded at melt temperatures of 330° C. and mold temperatures of 80° C. to form sheets measuring 60×80×2 mm, which were metallized with a copper layer in line with the process described in EP-A 305 846 after they had been subjected to the pretreatments described below in Table 2.

In particular, the following pretreatments were carried out:

P1: no pretreatment
P2: 10% by weight of HCl, aqueous solution, 30 min, room temperature
P3: 10% by weight of KOH, aqueous solution, 30 min, room temperature,
P4: 10% by weight of KOH in $CH_3OH$, 30 min, room temperature
P5: 10% by weight of KOH in $i-C_3H_7OH$, 30 min, room temperature
P6: 10% by weight of HCl in $CH_3OH$, 30 min, room temperature
P7: 10% by weight of KOH in $CH_3OH$, 15 min, room temperature
+2% by weight of HCl in $CH_3OH$, 5 min, room temperature To metallize the pretreated substrates they were first vacuum sputtered with a copper layer from 1 to 3 μm in thickness which was then built up to a thickness of 40±4 μm by electroplating with a current density of from 20 to 30 mA/cm².

To test the peel strength, 25 mm wide strips were sawn out of these sheets, and the adhesion of the metal coat was determined with a take-off speed of 30 mm/min at right angles to the sheet surface.

Table 2 shows the results of the adhesion measurements on molding compositions 1 to 11 following pretreatments P1 to P7.

TABLE 2

| Example | Molding composition No. | Pretreatment | Adhesion N/25 mm |
|---|---|---|---|
| 1C | 1 | P1 | 5 |
| 2C | 1 | P2 | 5 |
| 3C | 1 | P3 | 6 |
| 4 | 1 | P4 | 8 |
| 5C | 2 | P1 | 6 |
| 6C | 2 | P3 | 6 |
| 7 | 2 | P4 | 36 |
| 8 | 2 | P5 | 30 |
| 9C | 3 | P1 | 5 |
| 10 | 3 | P4 | 39 |
| 11 | 3 | P6 | 24 |
| 12 | 3 | P7 | 48 |
| 13C | 4 | P1 | 10 |
| 14 | 4 | P4 | 18 |
| 15 | 5 | P7 | 38 |
| 16 | 6 | P7 | 55 |
| 17C | 7 | P1 | 8 |
| 18 | 7 | P4 | 53 |
| 19C | 8 | P1 | 6 |
| 20 | 8 | P4 | 48 |
| 21C | 9 | P1 | 10 |
| 22 | 9 | P4 | 42 |
| 23 | 10 | P4 | 47 |
| 24 | 11 | P7 | 50 |

The results clearly show that the treatment with acidic or alkaline reagents in predominantly organic solvents gives better adhesions in the subsequent metallization than the treatment in aqueous solvents.

We claim:

1. A process for treating the surface of moldings based on a liquid crystalline polymer which comprises: applying to the surface of the moldings an acidic or alkaline reagent in a solvent, at least 60% by weight of the solvent being an organic solvent.

2. The process of claim 1, wherein the reagent is HCl.

3. The process of claim 1, wherein the reagent is KOH.

4. The process of claim 1, wherein the organic solvent is $CH_3OH$ or $i-C_3H_7OH$.

5. The process of claim 1, wherein at least 80% by weight of the solvent is an organic solvent.

6. The process of claim 1, wherein at least 100% by weight of the solvent is an organic solvent.

* * * * *